United States Patent [19]

Spies et al.

[11] Patent Number: 5,525,422
[45] Date of Patent: Jun. 11, 1996

[54] SELF-ADHESIVE TAPE WHICH CAN BE PARTIALLY DETACKIFIED BY RADIATION (DICING TAPE)

[75] Inventors: Manfred Spies; Christian Harder; Günter Guse; Claudia Feldt; Robert Meyer, all of Hamburg, Germany

[73] Assignee: Beiersdorf Aktiengesellschaft, Hamburg, Germany

[21] Appl. No.: 330,226

[22] Filed: Oct. 27, 1994

Related U.S. Application Data

[63] Continuation of Ser. No. 116,091, Sep. 2, 1993, abandoned.

[30] Foreign Application Priority Data

Sep. 15, 1992 [DE] Germany ............................ 42 30 784.8

[51] Int. Cl.$^6$ .............................. B32B 7/12; B32B 15/04; H01L 21/302; H01L 21/60
[52] U.S. Cl. .......................... 428/355; 428/343; 428/345; 428/354; 522/904; 437/209; 437/226
[58] Field of Search ....................................... 428/343, 345, 428/354, 355; 522/904; 437/226, 209

[56] References Cited

U.S. PATENT DOCUMENTS

| | | | |
|---|---|---|---|
| 4,720,317 | 1/1988 | Kuroda et al. ............................ | 156/250 |
| 4,847,137 | 7/1989 | Kellen et al. ............................. | 428/195 |
| 4,913,960 | 4/1990 | Kuroda et al. .......................... | 428/345 |
| 4,965,127 | 10/1990 | Ebe et al. ............................. | 428/345 X |
| 4,968,559 | 11/1990 | Kuroda et al. .......................... | 428/354 |
| 5,110,388 | 5/1992 | Komiyama et al. ................. | 428/345 X |
| 5,187,007 | 2/1993 | Ebe et al. ................................. | 428/343 |
| 5,238,876 | 8/1993 | Takeuchi et al. ........................ | 437/226 |
| 5,281,473 | 1/1994 | Ishiwata et al. ..................... | 428/354 X |

FOREIGN PATENT DOCUMENTS

| | | |
|---|---|---|
| 157508 | 3/1985 | European Pat. Off. . |
| 298448 | 7/1988 | European Pat. Off. . |
| 2743979 | 4/1979 | Germany . |
| 2184741 | 7/1987 | United Kingdom . |

OTHER PUBLICATIONS

DE 2743979 Abst.

*Primary Examiner*—Terrel Morris
*Attorney, Agent, or Firm*—Sprung Horn Kramer & Woods

[57] ABSTRACT

Radiation-crosslinkable self-adhesive tape (dicing tape) for the temporary fixing of wafers, having a support comprising a radiation-transparent film and a radiation-crosslinkable self-adhesive composition, characterized in that the polymeric self-adhesive composition contains copolymerized radiation initiators.

5 Claims, No Drawings

SELF-ADHESIVE TAPE WHICH CAN BE PARTIALLY DETACKIFIED BY RADIATION (DICING TAPE)

This application is a continuation of application Ser. No. 08/116,091, filed on Sep. 2, 1993 now abandoned.

The invention relates to a self-adhesive tape which can be partially detackified by radiation, a so-called dicing tape, as used for temporary fixing of wafers and the like during their processing.

In the production of chips, the wafer must first be very flat before the individual circuit elements and conductor tracks can be produced on the wafer. This is achieved by polishing, during which fixing and protection are necessary, as offered by a dicing tape. Adhering thereto, the wafer pretreated in this way is subjected to certain processes in order to cross the actual circuit elements and conductor tracks. These processes are predominantly photolithographic ones. Thereafter, the pretreated wafer is sawn up in order to obtain the individual chips. The wafer must also be fixed for the sawing operation, generally by means of the dicing tape, which at the beginning has a certain initial tack, which is specifically reduced when the sawing operation is complete in order to separate the chips. In the case of small chips, the separation is accomplished by piercing on the reverse with a needle and subsequently lifting off by means of a suction device. In the case of larger elements, this process fails since the chips can break. A dicing tape is necessary here, in which it must be possible specifically to reduce the tack after sawing so that piercing with a needle is superfluous.

Dicing tapes of this type have already been disclosed. Thus, EP-A 157 508 describes a thin self-adhesive tape which is intended for use in the processing of semiconductor wafers and which contains in the adhesive composition a subsequently admixed photo-sensitizer. The tack of this tape to wafers can be reduced by stretching and UV irradiation so that the wafers can be removed again from the tape by means of appropriate grippers/suckers.

EP-A 298 448 also discloses a radiation-crosslinkable self-adhesive tape of this type, in which cyanurates and isocyanurates are used in the adhesive composition in order to improve the UV crosslinking and thus the desired tack depression.

German Patent 2 743 979 has also already disclosed self-adhesive tapes which have a crosslinked polyacrylate adhesive composition which contains a copolymerized photoinitiator in order to crosslink the adhesive composition in a specific manner by UV radiation after coating onto the adhesive tape base, into the state of a broad-mesh chain linkage which is stable to post-crosslinking, as is typical of self-adhesive compositions (column 2, lines 23–28).

However, products of this prior art have serious disadvantages for the intended purpose of wafer processing.

As semiconductors for electronic applications, wafers are produced from materials of extremely high purity. These are subject to specific requirements which make it necessary to carry out not only mechanical but also chemical treatment with the greatest possible care. It must be ensured that any contact with foreign materials does not cause any low-molecular-weight constituents which are capable of migration to get onto or into the wafer. Impurities of this type would restrict or even prevent its use. In addition, there are toxicological considerations when working with corresponding adhesive compositions, since daily and extended handling of these materials is necessary at appropriately highly specialized workplaces.

However, German Patent 2 743 979 also fails to give any indication of the application intended here, since typical self-adhesive compositions are only produced therein after the very UV irradiation proposed (column 2, lines 23–28), while the aim here is to achieve a drastic depression in tack, i.e. a dicing tape is not comparable with a typical self-adhesive tape. In addition, the self-adhesive compositions of German Patent 2 743 979 cannot be detackified by irradiation. Instead, they achieve a limiting value of the crosslinking, which is not exceeded even on extended irradiation, during which the tack remains virtually unchanged.

The object set is achieved by means of a dicing tape as characterized in greater detail in the claims.

This dicing tape gives advantages, surprising to a person skilled in the art, in the processing of wafers. The copolymerzations of the photosensitizers into self-adhesive compositions gives a homogeneous product even during the copolymerization, allowing the production of the dicing tape according to the invention. This also means that the desired crosslinking, which causes the tack depression, is particularly uniform and efficient. This also applies in the case where films of moderate radiation transparency are used. In addition, the tack profile can be adjusted as desired, before and after crosslinking, both by the monomer combination and by the radiation intensity and duration. This tack profile is advantageously determined by the targeted incorporation of crystalline or amorphous polymer segments into the copolymer. Particularly advantageous is the use of long-chain acrylates, such as, for example, stearyl acrylate, whose side-chain crystallinity makes a particular contribution to the adhesive properties. Subsequent addition of reactive and toxic low-molecular-weight compounds for the crosslinking is not only unnecessary, but is intentionally avoided in the interests of keeping the wafer clean.

Backing materials which can be employed are conventional halogen-containing films, such as, for example, PVC, and halogen-free films, which offer significant advantages from ecological aspects. The films can have a one-layer structure or can be laminated in a number of layers, but preferably have a one-layer structure. Due to the selective character of the UV initiators, the incorporation of certain UV filters into the film system is unnecessary.

Suitable backing materials are all radiation-transparent films, in particular UV-transparent films, which can be built up either from homopolymers or from copolymers, such as, for example, polyethylene, polypropylene, PVC, polyester or ethylene-vinyl acetate copolymers, preferably films having a high elastic content, such as flexible PVC and polybutene or 1,2-polybutadiene or ethyl butyl acrylate copolymers as halogen-free variants. Certain flexible PVC and ethyl butyl acrylate copolymer grades offer the advantage that uniform stretching by up to 800% in the X and Z directions can be achieved. The film thicknesses are, in particular, between 5 and 400 μm, preferably between 20 and 80 μm. The use of an ethyl butyl acrylate copolymer as the support material in combination with a polyacrylate copolymer as the adhesive composition has proven particularly advantageous with respect to anchoring of the adhesive composition.

The polymerization can be carried out using any commercially available initiator system, in particular using a free-radical system, such as peroxides, azo compounds and dicarbonates, for example benzoyl peroxide, di-tert-butyl peroxide, diamyl peroxide, azobisisobutyronitrile, 2,2'-azobis(2-methylbutyronitrile), bis(4-t-butylcyclohexyl)peroxydicarbonate and diacetyl peroxydicarbonate. Particular preference is given to dibenzoyl peroxide.

These compounds can be employed individually or as mixtures.

The tack depression before separation of the sawn-through chips from the dicing tape is effected by radiation crosslinking, in particular by UV irradiation. The UV sensitizers used are compounds in which the UV-sensitive groups are bonded to polymerizable units. Examples of these are 2-oxo-1,2-diphenylethyl 2-propenoate (benzoin acrylate) and 4-(2-acryloyloxyethoxy) phenyl-2-hydroxy-2-propyl-ketone; preference is given to benzoin acrylate. These photosensitizers are employed, in particular, in amounts of from 0.1 to 5% by weight, preferably from 1 to 3% by weight.

These compounds can also be employed individually or as mixtures.

Suitable monomers for the synthesis of the adhesive system are acrylic acid and acrylates of the $H_2C=CR_1-CO-OR_2$ type, where $R_1$ is H or $CH_3$, $R_2$ is $C_1-C_{24}$ with linear and branched carbon chains in the ester unit, ethyl diglycol, 4-t-butylcyclohexyl, 2-hydroxyethyl, hydroxypropyl, hydroxybutyl, dimethylaminoethyl, preferably n-butyl to stearyl.

Corresponding variants based on methacrylic acid and methacrylates are likewise suitable.

It is also possible to employ vinyl acetate and diverse vinyl alkyl ethers of the

$H_2C=CH-O-R$ type where R is methyl, ethyl, propyl, isobutyl, octadecyl, cyclohexyl or 4-hydroxybutyl, likewise vinyl pyrrolidone, vinyl caprolactam, vinyl carbazole and 1-vinylimidazole.

EXAMPLE

Polymer Preparation

A 2-liter polymerization apparatus made of glass or steel, with stirrer, reflux condenser, thermometer and gas-inlet tube was charged with 192 g of 2-ethylhexyl acrylate, 200 g of stearyl acrylate, 8 g of benzoin acrylate and 266 g of acetone. The solution was first freed from oxygen by flushing with nitrogen with stirring (about 120 rpm) and then heated to the boil.

The polymerization was initiated by addition of a total of 0.4% by weight of dibenzoyl peroxide in portions and was continued. During the polymerization time of about 20 hours, the polymerization mixture was repeatedly diluted with solvent (petroleum ether 60/95) depending on the viscosity, so that the finished polymer solution had a solids content of 30–60% by weight. Yield [%]: 99.4 K value []: 83.1

Coating

The above-described polymer solution was used as follows.

Support: EBA film, thickness 70 μm.

1st Operation

Single-sided corona pretreatment in order to improve the composition anchoring at 1.85 kW and 10 m/min (corresponds to about 38 mN/m)

2nd Operation

As soon as possible after the corona treatment, the composition was coated onto this pretreated side (rate: 1 m/min; composition weight: about 10–15 g/m², drying in six zones: 60°/70°/70°/80°/80°/90° C). The coated tape was covered with backing film/backing paper.

3rd Operation

The finished tape was subjected to electron-beam irradiation on the film-support side (170 kV at a rate of 4–5 m/min in order to achieve a dose of about 10 kGy) in order to improve the property profile of the film and the anchoring of the adhesive composition.

Product Properties

The dicing tape produced as outlined above has an initial tack to a silicon wafer of 1.1 N/cm.

After the UV irradiation (stationary; 30 sec Hanau Q 1200), the tack of the sample drops to 0.15 N/cm.

The irradiation was carried out using commercially available UV irradiation sources. After the conventional method of stretching the tape with the wafers stuck thereto and UV irradiation as described, the wafers were easy to remove without damage.

Test Methods

K value:

The K value was determined by the conventional methods of capillary viscometry (in Ubbelohde viscometers). The measurements were carried out on solutions of 1 g of polymer in 100 ml of toluene at 25° C.

Tack

The non-irradiated test strips (width: 20 mm) were stuck to the rough side of the wafer surface (unpolished side), without leaving any air bubbles. The tape was subsequently pressed on carefully by hand. The measurement was carried out using an electronic tensile tester within one minute of application (peel-off angle: 180°, peel-off rate: 300 mm/min).

We claim:

1. In the method of production of a chip including the steps of temporarily fixing a wafer to a substrate and subsequently separating said wafer from said substrate, wherein the improvement comprises effecting said temporary fixing by means of a pressure sensitive adhesive tape, wherein said pressure sensitive adhesive tape comprises a backing which is a copolymer of ethyl-butyl-acrylate, is stretchable in both directions of its plane, is 5 to 400 μm thick and has coated thereon a self-adhesive composition, said self-adhesive composition comprising a copolymer of stearyl acrylate and benzoin acrylate.

2. The method according to claim 1, wherein the backing is from 20 to 80 μm in thickness.

3. The method according to claim 1, wherein the separation of said wafer from said substrate is effected by subjecting said pressure sensitive adhesive tape to radiation.

4. A pressure sensitive adhesive tape, wherein said pressure sensitive adhesive tape comprises a backing which is a copolymer of ethyl-butyl-acrylate, is stretchable in both directions of its plane, is 5 to 400 μm thick and has coated thereon a self-adhesive composition, said self-adhesive composition comprising a copolymer of stearyl acrylate and benzoin acrylate.

5. A pressure sensitive adhesive tape according to claim 4, wherein the backing is from 20 to 80 μm in thickness.

* * * * *